United States Patent
Nakamura

(10) Patent No.: US 6,798,077 B2
(45) Date of Patent: Sep. 28, 2004

(54) SEMICONDUCTOR DEVICE WITH STAGGERED OCTAGONAL ELECTRODES AND INCREASED WIRING WIDTH

(75) Inventor: Akio Nakamura, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/440,271

(22) Filed: May 19, 2003

(65) Prior Publication Data

US 2003/0197251 A1 Oct. 23, 2003

Related U.S. Application Data

(62) Division of application No. 09/956,123, filed on Sep. 20, 2001, now Pat. No. 6,590,296.

(30) Foreign Application Priority Data

Dec. 4, 2000 (JP) .................................... 2000-368113

(51) Int. Cl.[7] .......................... H01L 23/48; H01L 23/52; H01L 29/40
(52) U.S. Cl. .................. 257/786; 257/696; 257/698; 257/208; 257/203; 257/784; 257/673; 257/674
(58) Field of Search ........................ 257/786, 696, 257/698, 208, 203, 784, 673, 674, 730, 690, 691, 773, 207

(56) References Cited

U.S. PATENT DOCUMENTS 5,814,892 A 9/1998 Steidl et al.

| | | | |
|---|---|---|---|
| 6,215,184 B1 | 4/2001 | Stearns et al. | |
| 6,392,685 B1 | 5/2002 | Nagahata et al. | |
| 6,410,990 B2 | 6/2002 | Taylor et al. | |
| 2002/0113319 A1 | 8/2002 | Ohno | |
| 2002/0117757 A1 | 8/2002 | Sakamoto et al. | |

FOREIGN PATENT DOCUMENTS

| | | | | |
|---|---|---|---|---|
| EP | 0588481 A1 | * | 3/1994 | |
| JP | 60-35524 | * | 2/1985 | ................ 257/773 |
| JP | 60-154652 | | 8/1985 | |
| JP | 1-1-7549 | | 4/1989 | |
| JP | 3-237742 | * | 10/1991 | ................ 257/203 |
| JP | 10-74790 | | 3/1998 | |
| JP | 2000-150706 | | 5/2000 | |

* cited by examiner

Primary Examiner—Alexander Oscar Williams
(74) Attorney, Agent, or Firm—Volentine Francos, PLLC

(57) ABSTRACT

A semiconductor device having electrodes formed along a peripheral part thereof in a staggered arrangement of lines including inside-line, central-line and outside-line electrodes. The inside-line electrodes are octagonal shaped with hypotenuses on the central-line electrode and the pellet sides thereof. The central-line electrodes are octagonal shaped with hypotenuses on the inside-line and outside-line electrode sides thereof. The maximum width of outside-line electrode wires between the hypotenuses of adjacent inside-line and central-line electrodes depends on the distance between centers of the inside-line and central-line electrodes, minimum lengths of the inside-line and central-line electrodes and electrode protective film, and the necessary minimum conductor interval between the central-line and inside-line electrodes. The position and form of the central-line and inside-line electrodes are determinable based on the given relationship and the necessary value of current.

10 Claims, 8 Drawing Sheets

SEMICONDUCTOR DEVICE WITH STAGGERED OCTAGONAL ELECTRODES AND INCREASED WIRING WIDTH

CROSS REFERENCE TO RELATED APPLICATIONS

This is a divisional application of application Ser. No. 09/956,123, filed Sep. 20, 2001 now U.S. Pat. No. 6,590,296, which is hereby incorporated by reference in its entirety for all purposes.

BACKGROUND OF THE INVENTION

The present invention relates to a semiconductor device and more particularly to a semiconductor device with staggered arrangement in three lines on the peripheral part of the surface of a semiconductor pellet.

DESCRIPTION OF THE RELATED ART

FIGS. 8 and 9 show the configuration of an electrode with staggered arrangement on the peripheral part of the surface of a semiconductor pellet in conventional art. FIG. 8 shows inside and outside electrodes 402 in two lines with staggered arrangement on the peripheral part of a semiconductor pellet 401. As shown in FIG. 9, an inside-line electrode 403 has a square shape and an outside-line electrode 404 has a square shape or a rectangle shape in which the ratio of the sides is from 1 to 2.

However, the pad electrode arranged conventionally has following problems:

1. Since the wiring connected to the outside-line electrode is arranged to pass between the adjacent inside-line electrodes and the width of wiring has to be narrower than the interval between the inside-line electrodes, the pad electrode cannot be used for a terminal for a large amount of electric current and a grand terminal.
2. In the wire bonding, the wiring mistake is caused in a few cases by the wrong recognition of the adjacent pad electrode for the wire-bonding pad electrode.
3. The neighboring wires contact each other in a few cases in the wire bonding by arranging the outside-line electrode near the center of the inside pad electrode.

SUMMARY OF THE INVENTION

An object of the present invention is to provide a novel and improved semiconductor device capable of widening the width of wiring for the outside electrode and embodying the wire bonding smoothly.

To solve the problem described above, the present representative invention provides:

A semiconductor device with staggered arrangement in three lines with an inside-line electrode, a central-line electrode and an outside-line electrode on the peripheral part of the surface of a semiconductor pellet, wherein the inside-line electrode configures a hexagonal electrode having a hypotenuse on the central-line electrode side formed to cut vertically on the position at a distance of the sum of the minimum length (R) of the electrode necessary for wire-bonding and the minimum length (F) of the electrode protective film from the center of the electrode on the line connecting the center of a rough square shaped electrode with each side consisted of the sum of the minimum length (R) of the electrode necessary for wire-bonding and the minimum length (F) of the electrode protective film and the center of the adjacent central-line electrode, the central-line electrode configures a hexagonal electrode having a hypotenuse on the inside-line electrode side formed to cut vertically on the position at a distance of the sum of the minimum length (R) of the electrode necessary for wire-bonding and the minimum length (F) of the electrode protective film from the center of the electrode on the line connecting the center of a rough square shaped electrode with each side consisted of the sum of the minimum length (R) of the electrode necessary for wire-bonding and the minimum length (F) of the electrode protective film and the center of the adjacent inside-line electrode; and a semiconductor device wherein the maximum wiring width of the outside-line electrode wired intermediately parallel to the hypotenuse of the central-line electrode and the hypotenuse of the inside-line electrode is calculated with a following expression, considering the necessary minimum conductor interval (I) between the central-line electrode and the inside-line electrode;

$$\text{the maximum wiring width} = (A^2 + B^2)^{1/2} - (R + F + I) \times 2$$

Since the present invention can achieve the width of wiring of the outside-line electrode connected to the internal circuit, which is wider than the conventional width of wiring, the outside-line electrode can be used as the one for a large amount of electric current, for example, an electric power supply. Further, since the electrode of the inside-line electrode and the electrode of the outside-line electrode are set apart each other, in recognizing the position of the electrode at the process of wire bonding, the adjacent electrode is not wrongly recognized.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments. In the drawings.

DETAILED DESCRIPTION OF THE PREFERRED EMBODIMENTS

Figure 1:
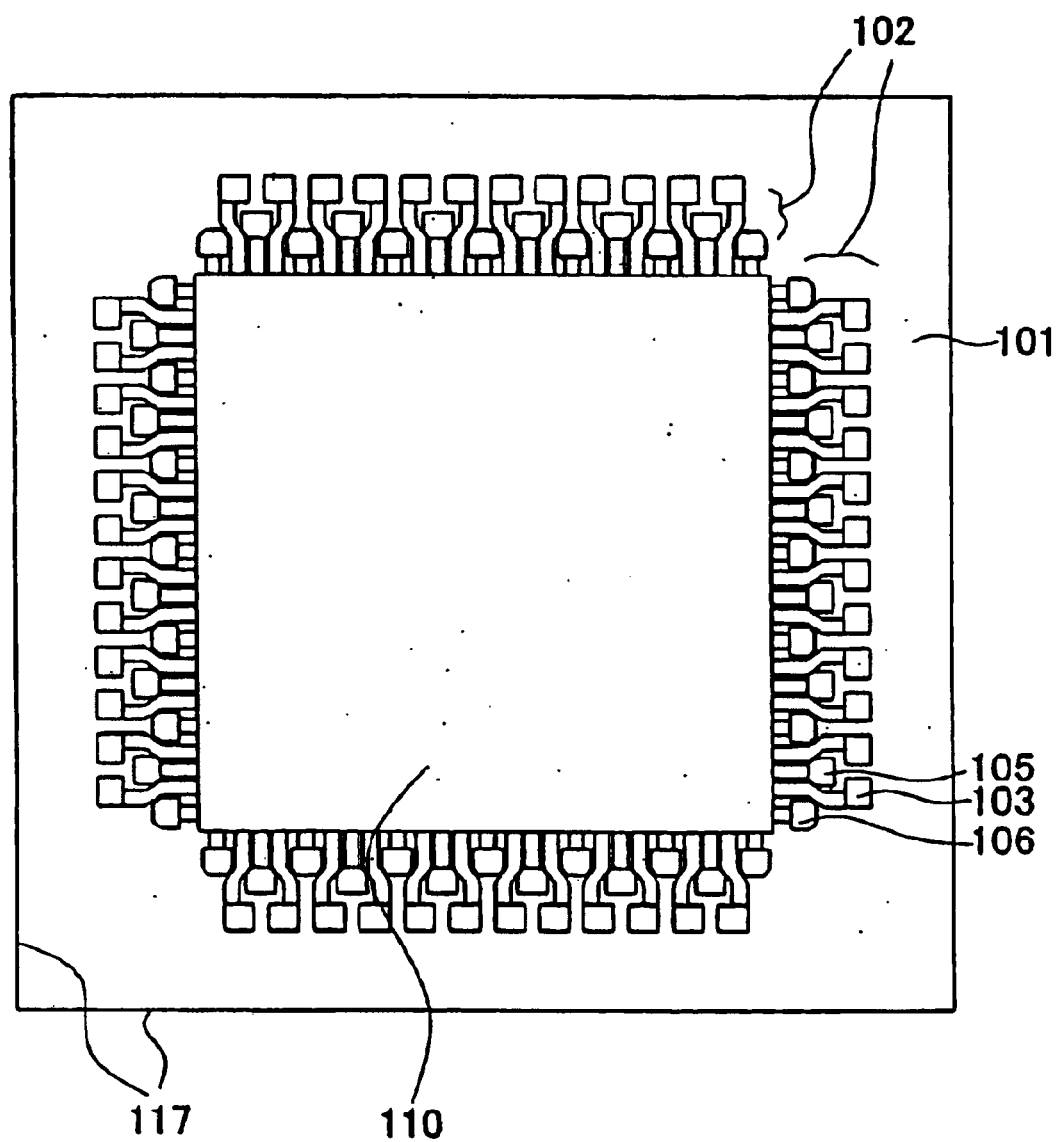
FIG. 1 is a top plan view of a semiconductor device of first embodiment.

Hereinafter, the preferred embodiments of the present invention will be described in detail with reference to the accompanying drawings. Same reference numerals are attached to components having the same functions in following description and the accompanying drawings and a description thereof is omitted.

(First Embodiment)

First, the first embodiment will be described in reference to FIGS. 1 and 2. It is to be noted that FIG. 1 is a top plan view of the semiconductor device of this embodiment.

First, as shown in FIG. 1, an outside-line electrode 103, a central-line electrode 105 and an inside-line electrode 106 of a semiconductor pellet 101 have a staggered arrangement in three lines on the peripheral part 102 of a semiconductor pellet 101. The outside-line electrode is formed in a square shape or a rectangle shape in which the ratio of the sides is from 1 to 2. The central-line electrode configures a hexagonal electrode having a hypotenuse formed to cut two corners at predetermined degrees on the inside-line electrode side of the rough square shaped electrode. The inside-line electrode configures a hexagonal electrode having a hypotenuse formed to cut the two corners at predetermined degrees on the central-line electrode side of the rough square shaped electrode.

In addition, between the central-line electrode and the inside-line electrode, wiring for connecting an internal circuit 110 of the semiconductor pellet 101 to the outside-line electrode is formed parallel to the hypotenuses of the central-line electrode and the inside-line electrode.

Figure 2A:
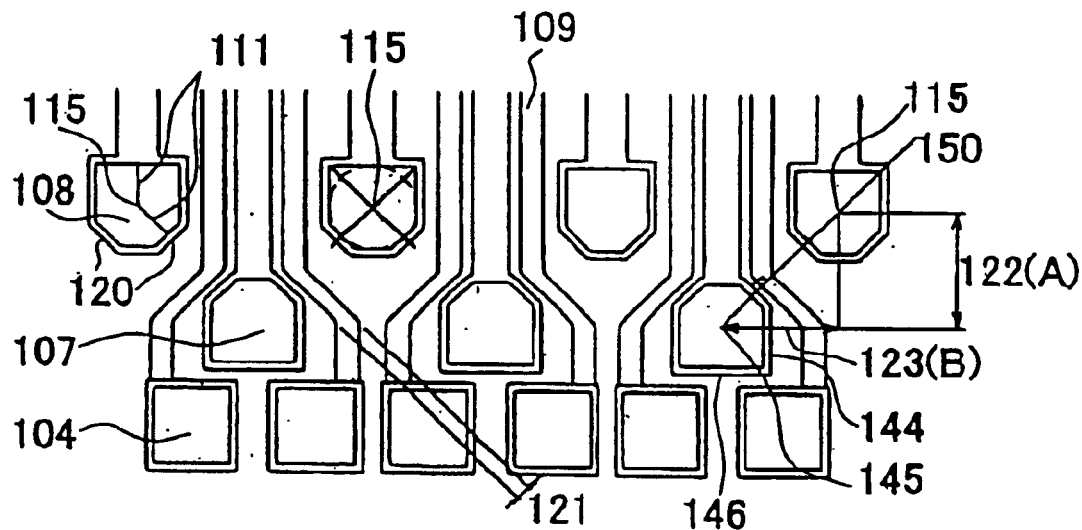
FIG. 2 is a partially enlarged view of an electrode arranged in the semiconductor device of the first embodiment.
Figure 2B:
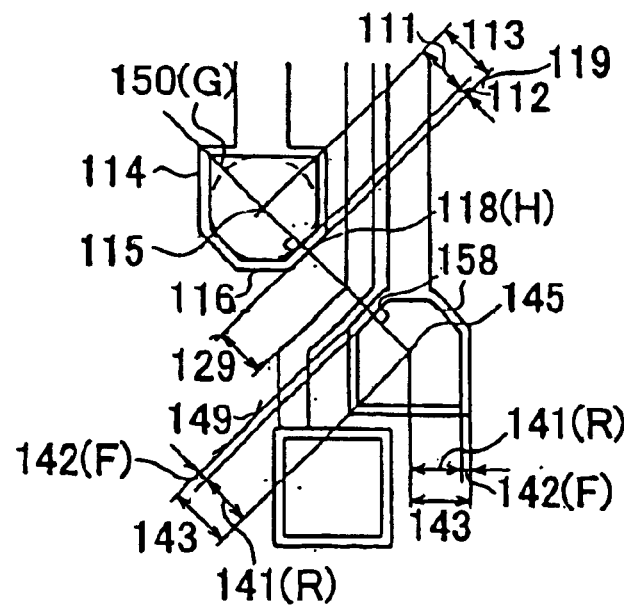

Next, the explanations of the electrodes and the wiring arranged in the semiconductor device of this embodiment will be provided in reference to FIG. 2. It is to be noted that FIG. 2 is a partially enlarged view of the electrode arranged in the semiconductor device of the present invention.

First, as shown in FIG. 2, a basic pattern of an inside-line electrode 108 is a rough square shaped electrode and the each side is formed parallel or vertically to a pellet side 117. The length of the each side of the basic rough square shaped electrode is expressed by the sum of the minimum radius (R) 111 of the electrode necessary for wire-bonding and the minimum width (F) 112 of the electrode protective film necessary for forming the electrode protective film from the center 115 of the electrode, that is, a distance 113.

In this embodiment, the inside-line electrode 108 configures a hypotenuse formed to cut the rough square shaped electrode in a direction 119 which is perpendicular to a line segment G on the position (H) 118 at a distance of the sum of the minimum radius (R) 111 of the electrode necessary for wire-bonding and the minimum width (F) 112 of the electrode protective film necessary for forming the electrode protective film, on the line segment (G) 150 connecting the center 145 of the adjacent central-line electrode 107 and the center 115 of the inside-line electrode 108. In this embodiment, two hypotenuses are formed to cut two corners on the central-line electrode side of the inside-line electrode 108.

Since the inside-line electrode 108 has the hypotenuse on the position at a distance between the center of the basic rough square shaped electrode and each side of the electrode, the center 115 of the electrode becomes the center of the inscribing circle in contact with each side which is horizontal and vertical to the pellet side and with the hypotenuses.

In this embodiment, the inside-line electrode 108 configures a hexagonal electrode having two hypotenuses formed to cut the two corners facing the central-line electrode of the basic rough square shaped electrode at predetermined degrees and predetermined positions. Two sides 114 vertical to the pellet side 117 and two sides 116 horizontal to the pellet side 117 are the four sides of the basic rough square shaped electrode, and hypotenuses 120 formed to face the central-side electrode are the remaining two sides.

It is to be noted that a protective film to protect the electrode formed on the inside-line electrode 108 at the minimum width (F) 112 parallel to each side 114, 116 and 120 of the electrode.

On the other hand, the central-line electrode 107 configures a hexagonal electrode having a hypotenuse formed to cut two corners at predetermined degrees on the pellet side (the direction of the inside-line electrode) of the basic rough square shaped electrode. It is to be noted that the following description of the center of the electrode represents the point located at the same distance from each side of the basic rough square shaped electrode.

On the other hand, the basic pattern of the central-line electrode 107 is also a rough square shaped electrode, and the each side is formed parallel or vertically to the pellet side. The length of the each side of the rough square shaped electrode is expressed by the sum of the minimum radius (R) 141 of the electrode necessary for wire-bonding and the minimum width (F) 142 of the electrode protective film necessary for forming the electrode protective film from the center 145 of the electrode, that is, a distance 143.

In this embodiment, the central-line electrode 107 has a hypotenuse formed to cut the rough square shaped electrode in a direction 149 which is perpendicular to a line segment G, on the position (H) 148 at a distance of the sum of the minimum radius (R) 141 of the electrode necessary for wire-bonding and the minimum radius (F) 142 of the electrode necessary for forming the electrode protective film, on the line segment (G) 150 connecting the center 115 of the adjacent inside-line electrode 108 and the center 145 of the central-line electrode 107. In this embodiment, two hypotenuses are formed to cut two corners on the inside-line electrode side of the central-line electrode 107.

Since the central-line electrode 107 has the hypotenuse on the position at a distance between the center of the basic rough square shaped electrode and each side of the electrode, the center 145 of the electrode becomes the center of the inscribing circle in contact with each side which is horizontal and vertical to the pellet side and the hypotenuses.

In this embodiment, the central-line electrode 107 configures a hexagonal electrode having a hypotenuse formed to cut the two corners facing the inside-line electrode of the basic rough square shaped electrode at predetermined degrees and predetermined positions. Two sides 144 vertical to the pellet side 117 and two sides 146 horizontal to the pellet side 117 are the four sides of the basic rough square shaped electrode, and hypotenuses 158 formed to face the inside-side electrode are the remaining two sides.

It is to be noted that a protective film to protect the electrode formed on the central-line electrode 107 at the minimum width (F) 142 parallel to each side 144, 146 and 158 of the electrode.

In this embodiment, the central-line electrode 107 and the inside-line electrode 108 are the hexagonal electrodes on which the hypotenuses facing each other are formed.

In addition, the wiring, which connects the internal circuit to the outside-line electrode, is formed between the central-line electrode and the inside-line electrode. In this embodiment, the wiring for the outside-line electrode is formed parallel to the hypotenuses between the inside-line electrode and the central-line electrode.

The maximum width 121 of the wiring for the outside-line electrode, which is formed intermediately parallel to the hypotenuses 120 and 158 of the central-line electrode 107 and the inside-line electrode 108, is decided by the distance between the center of the adjacent central electrode 107 and the center of the inside-line electrode 108, which is calculated from the distance of vertical direction (A) 122 between the centers of the electrodes and the distance of horizontal direction (B) 123 between the centers of the electrodes, the minimum length (R) 111 and 141 of the electrode necessary for wire-bonding, the minimum length (F) 112 and 142 of the electrode protective film, and the minimum length (I) 129 of the electric conductor, and is showed by a following expression the maximum wiring width 121 between the hypotenuses=$(A^2+B^2)^{1/2}-(R+F+I)\times 2$ Also, assuming that the thicknesses of the wirings are roughly identical each other, the maximum current of the outside-line electrode 104 will be proportional to the width 121 of wiring of the hypotenuse. Consequently, the width between the hypotenuses is to be decided by the necessary value of the current. The interval 122 and 123 between the adjacent central-line electrode 107 and the inside-line electrode 108, and the position and the form of the central-line electrode 107 and the inside-line electrode 108, is to be decided by calculating backward from the above-mentioned expression.

Since this embodiment can achieve the width of wiring of the outside-line electrode connected to the internal circuit, which is wider than the conventional width of wiring, the outside-line electrode can be used as the one for a large amount of electric current, for example, an electric power supply. Further, since the electrode of the inside-line electrode and the electrode of the outside-line electrode are set apart each other, in recognizing the position of the electrode at the process of wire bonding, the adjacent electrode is not wrongly recognized.

(Second Embodiment)

In the embodiment described above, a hexagonal electrode having a hypotenuse formed to cut the two corners facing each other of a basic rough square shaped electrode is introduced as a central electrode and an inside-line electrode. In this embodiment, an octagonal electrode having a hypotenuse formed to cut all of the four corners of a basic rough square shaped electrode is introduced as a central electrode and an inside-line electrode.

Next, the second embodiment will be described in reference to FIGS. 3 and 4. It is to be noted that FIG. 3 is a top plan view of the semiconductor device of the present invention.

Figure 3:
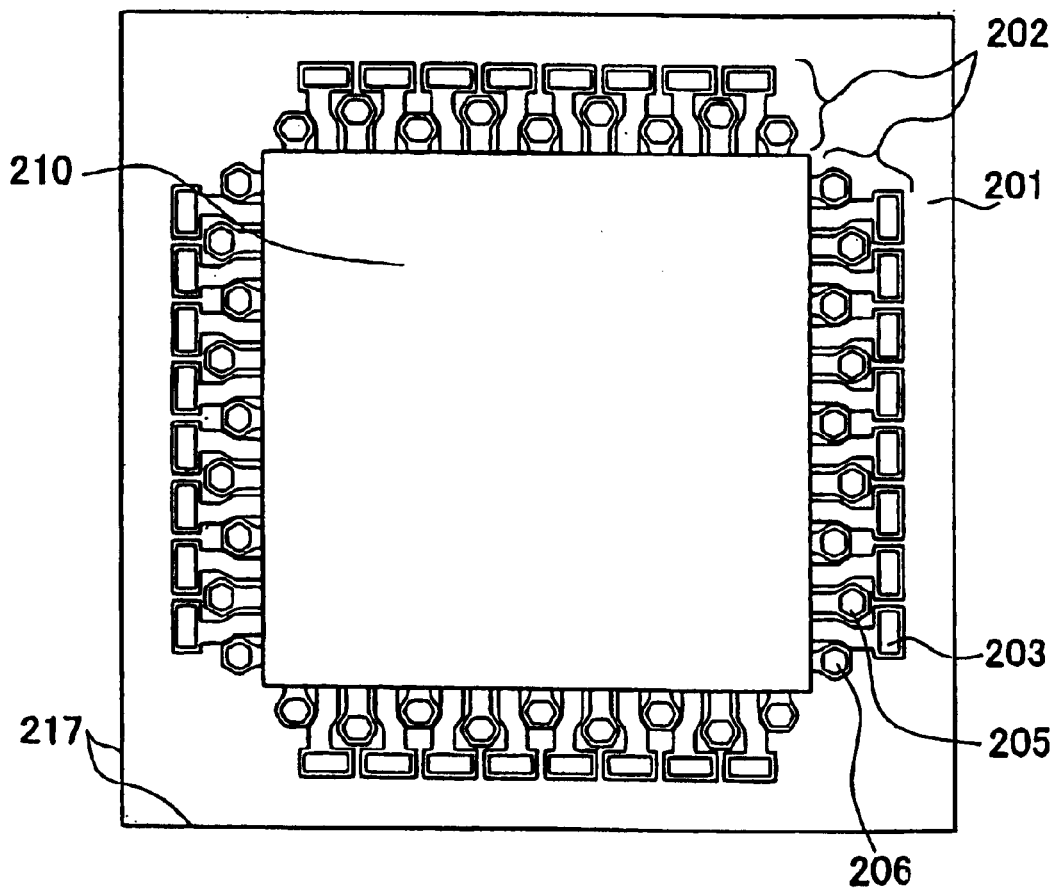
FIG. 3 is a top plan view of a semiconductor device of second embodiment.

First, as shown in FIG. 3, an outside-line electrode 203, a central-line electrode 205 and an inside-line electrode 206 of a semiconductor pellet 201 have a staggered arrangement in three lines on the peripheral part 202 of a semiconductor pellet 201. The outside-line electrode is formed in a square shape or a rectangle shape in which the ratio of the sides is from 1 to 2. The central-line electrode configures an octagonal electrode having a hypotenuse formed to cut four corners of the rough square shaped electrode at predetermined degrees. The inside-line electrode configures an octagonal electrode having a hypotenuse formed to cut the four corners of the rough square shaped electrode at predetermined degrees.

In addition, between the central-line electrode and the inside-line electrode, wiring for connecting an internal circuit 210 of the semiconductor pellet 201 to the outside-line electrode is formed parallel to the hypotenuses of the central-line electrode and the inside-line electrode.

Figure 4A:
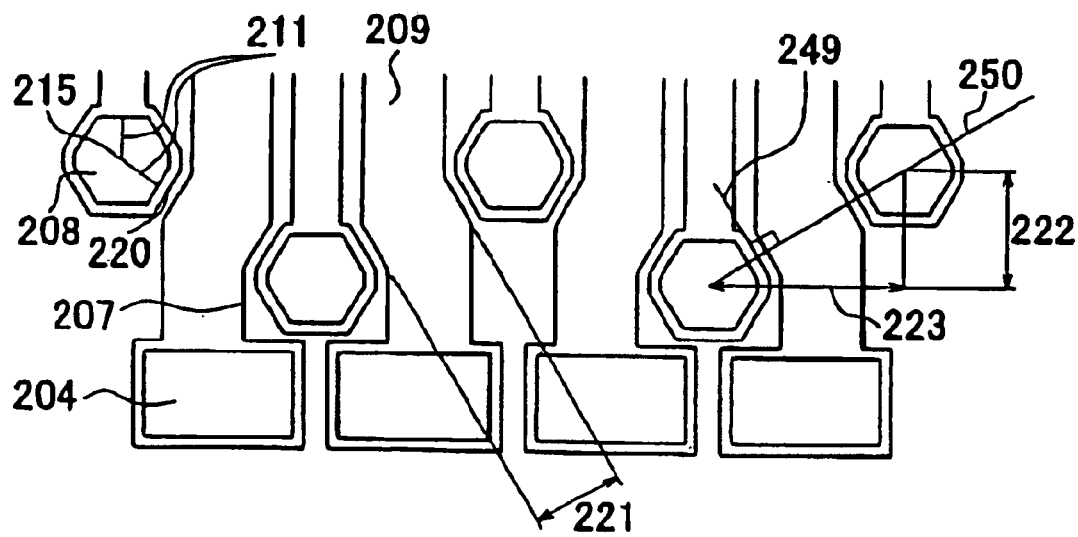
FIG. 4 is a partially enlarged view of an electrode arranged in the semiconductor device of the second embodiment.
Figure 4B:
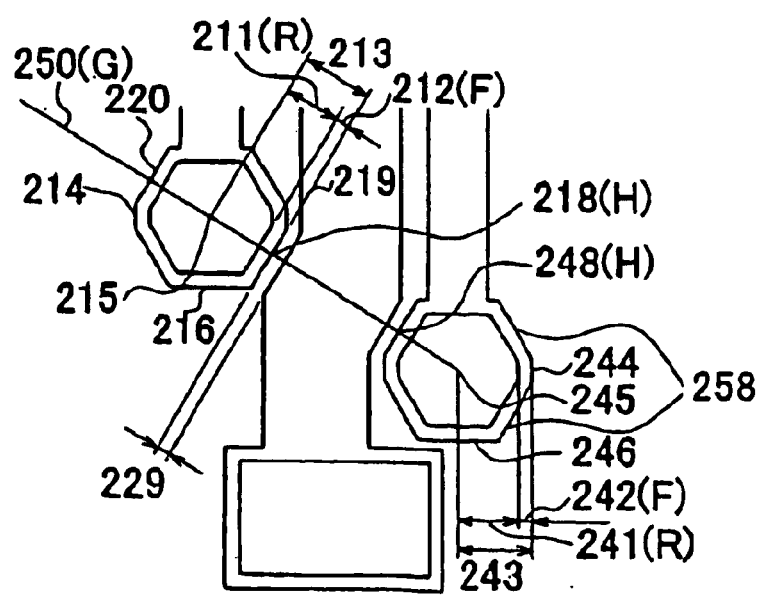

Next, the explanations of the electrodes and the wiring arranged in the semiconductor device of this embodiment will be provided in reference to FIG. 4. It is to be noted that FIG. 4 is a partially enlarged view of the electrode arranged in the semiconductor device of the present invention.

First, as shown in FIG. 4, a basic pattern of an inside-line electrode 208 is a rough square shaped electrode and the each side is formed parallel or vertically to a pellet side 217. The length of the each side of the basic rough square shaped electrode is expressed by the sum of the minimum radius (R) 211 of the electrode necessary for wire-bonding and the minimum width (F) 212 of the electrode protective film necessary for forming the electrode protective film from the center 215 of the electrode, that is, a distance 213.

In this embodiment, the inside-line electrode 208 has two hypotenuses formed to cut the rough square shaped electrode in a direction 219 which is perpendicular to a line segment G on the position (H) 218 at a distance of the sum of the minimum radius (R) 211 of the electrode necessary for wire-bonding and the minimum width (F) 212 of the electrode protective film necessary for forming the electrode protective film, on the line segment (G) 250 connecting the center 245 of the adjacent central-line electrode 207 and the center 215 of the inside-line electrode 208. In this embodiment, different from the one described above, a hypotenuse on the pellet side cutting two corners in the direction on a pellet 210 side of the inside-line electrode 208 is formed symmetrically and parallel to the hypotenuse on the central-line electrode side.

Since the inside-line electrode 208 has the hypotenuse on the position at a distance between the center of the basic rough square shaped electrode and each side of the electrode, the center 215 of the electrode becomes the center of the inscribing circle in contact with each side which is horizontal and vertical to the pellet side and with the hypotenuses.

In this embodiment, the inside-line electrode 208 configures a octagonal electrode having four hypotenuses formed to cut all the four corners of the basic rough square shaped electrode at predetermined degrees and predetermined positions. Two sides 214 vertical to the pellet side 217 and two sides 216 horizontal to the pellet side 217 are the four sides of the basic rough square shaped electrode, and hypotenuses 220 formed to cut all the four corners are the remaining four sides.

It is to be noted that a protective film to protect the electrode formed on the inside-line electrode 208 at the minimum width (F) 212 parallel to each side of the electrode.

On the other hand, a basic pattern of a central-line electrode 207 is a rough square shaped electrode, and the each side is formed parallel or vertically to a pellet side 217. The length of the each side of the basic rough square shaped electrode is expressed by the sum of the minimum radius (R) 241 of the electrode necessary for wire-bonding and the minimum width (F) 242 of the electrode protective film necessary for forming the electrode protective film from the center 245 of the electrode, that is, a distance 243.

In this embodiment, the central-line electrode 207 has two hypotenuses formed to cut the rough square shaped electrode in a direction 249 which is perpendicular to a line segment G, on the position (H) 248 at a distance of the sum of the minimum radius (R) 241 of the electrode necessary for wire-bonding and the minimum width (F) 242 of the electrode protective film necessary for forming the electrode protective film, on the line segment (G) 250 connecting the center 215 of the adjacent inside-line electrode 208 and the center 245 of the central-line electrode 207. In this embodiment, different from the one described above, a hypotenuse on the outside-line electrode side cutting two corners in the direction opposite to the pellet 210 side of the inside-line electrode 208, that is, the direction of the outside-line electrode 204, is formed symmetrically and parallel to the hypotenuse on the inside-line electrode side.

Since the central-line electrode 207 has the hypotenuse on the position at a distance between the center of the basic rough square shaped electrode and each side of the electrode, the center 245 of the electrode becomes the center of the inscribing circle in contact with each side which is horizontal and vertical to the pellet side and the hypotenuses.

In this embodiment, the central-line electrode 207 configures a octagonal electrode having four hypotenuses formed to cut all the four corners of the basic rough square shaped electrode at predetermined degrees and predetermined positions. Two sides 244 vertical to the pellet side 217 and two sides 246 horizontal to the pellet side 217 are the four sides of the basic rough square shaped electrode, and hypotenuses 258 formed to cut all the four corners are the remaining four sides.

It is to be noted that a protective film to protect the electrode formed on the central-line electrode 207 at the minimum width (F) 242 parallel to each side of the electrode.

In this embodiment, the central-line electrode 207 and the inside-line electrode 208 are the hexagonal electrodes on which the hypotenuses facing each other are formed and on which the hypotenuses cutting the two corners in the opposite direction are formed at the same time.

In addition, the wiring, which connects the internal circuit to the outside-line electrode, is formed between the central-line electrode and the inside-line electrode. In this embodiment, the wiring for the outside-line electrode is formed parallel to the hypotenuses between the inside-line electrode and the central-line electrode.

The maximum width of wiring 221 for the outside-line electrode, which is formed intermediately parallel to the hypotenuses 220 and 258 of the inside-line electrode 208 and the central-line electrode 207, is decided by the distance between the center of the adjacent central electrode 207 and the center of the inside-line electrode 208, which is calculated from the distance of vertical direction (A) 222 between the centers of the electrodes and the distance of horizontal direction (B) 223 between the centers of the electrodes, the minimum length (R) 211 and 241 of the electrode necessary for wire-bonding, the minimum length (F) 212 and 242 of the electrode protective film, and the minimum length (I) 229 of the electric conductor, and is showed by a following expression;

The maximum wiring width 221 between the hypotenuses=$(A^2+B^2)^{1/2}-(R+F+I)\times 2$.

Also, assuming that the thicknesses of the wirings are roughly identical each other, the maximum current of the outside-line electrode 204 will be proportional to the width 221 of wiring of the hypotenuse. Consequently, the width between the hypotenuses is to be decided by the necessary value of the current. The interval 223 between the adjacent central-line electrode 207 and the inside-line electrode 208, and the position and form of the central-line electrode 207 and the inside-line electrode 208, is to be decided by calculating backward from the above-mentioned expression.

Since this embodiment can achieve the width of wiring of the outside-line electrode connected to the internal circuit, which is wider than the conventional width of wiring, the wiring of the outside-line electrode can be used as the one for a large amount of electric current, for example, an electric power supply. Further, since the electrode of the inside-line electrode and the electrode of the outside-line electrode are set apart each other, in recognizing the position of the electrode at the process of wire bonding, the adjacent electrode is not wrongly recognized. In addition, in this embodiment, since the inside-line electrode has a hypotenuse formed to cut two corners on the side of the pellet side, the freedom degree of wiring of the outside-line electrode can be enhanced. Consequently, the short defect at the process of wire bonding is to be decreased gradually. Further, since the central-line electrode has a hypotenuse formed to cut two corners on the side of the pellet side, the freedom degree of wiring can be further enhanced.

(Third Embodiment)

In the embodiment described above, the explanation is provided with regard to the configuration that a hexagonal or an octagonal electrode is introduced as a central electrode and an inside-line electrode. In this embodiment, an electrode with a two-layer structure configuring an octagonal lower electrode on the lower layer and a square upper electrode on the upper layer is introduced as a central electrode and an inside-line electrode.

Next, the third embodiment will be described in reference to the FIGS. 5, 6 and 7. It is to be noted that FIG. 5 is a top plan view of the semiconductor device of the present invention.

Figure 5:
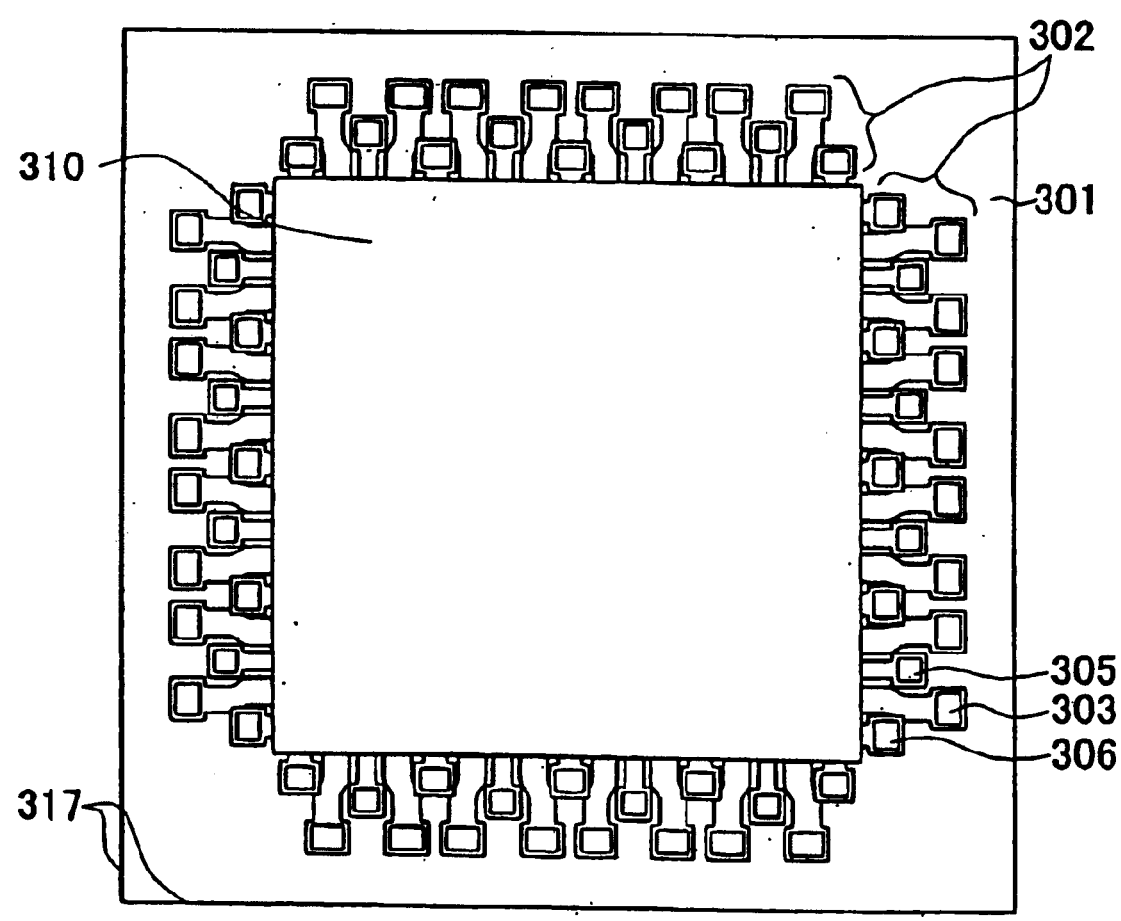
FIG. 5 is a top plan view of a semiconductor device of third embodiment.

First, as shown in FIG. 5, an outside-line electrode 303, a central-line electrode 305 and an inside-line electrode 306 of a semiconductor pellet 301 have a staggered arrangement in three lines on the peripheral part 302 of a semiconductor pellet 301. The outside-line electrode is formed in a square shape or a rectangle shape in which the ratio of the sides is from 1 to 2. In this embodiment, it is to be noted that the central-line electrode and the inside-line electrode configure a two-layer structure configuring an octagonal lower electrode on the lower layer and a square upper electrode on the upper layer.

In addition, between the lower electrode of the central-line electrode and the lower electrode of the inside-line electrode, wiring for connecting an internal circuit 310 of the semiconductor pellet 301 to the outside-line electrode is formed parallel to the hypotenuses of the central-line electrode and the inside-line electrode.

Figure 6A:
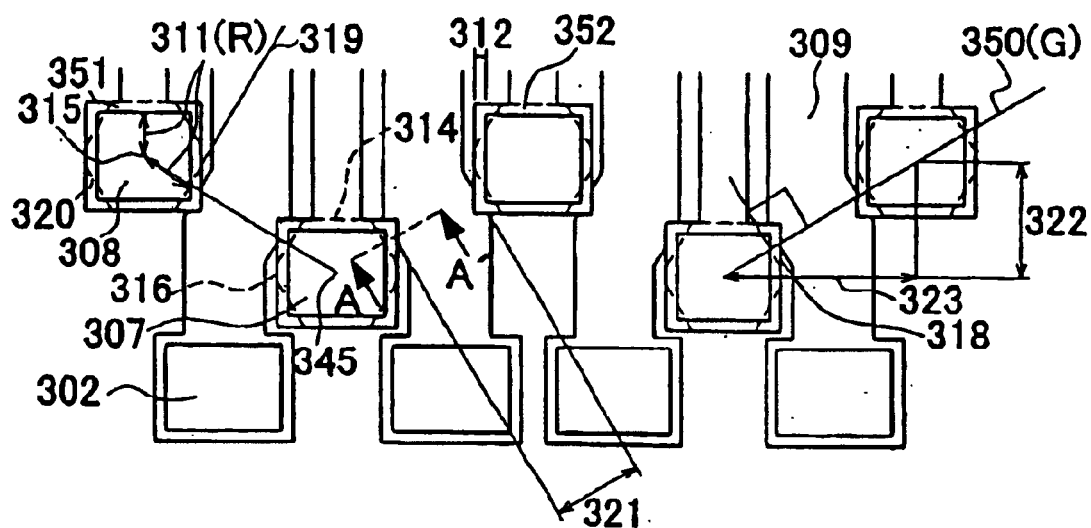
FIG. 6 is a partially enlarged view of an electrode arranged in the semiconductor device of the third embodiment.
Figure 6B:
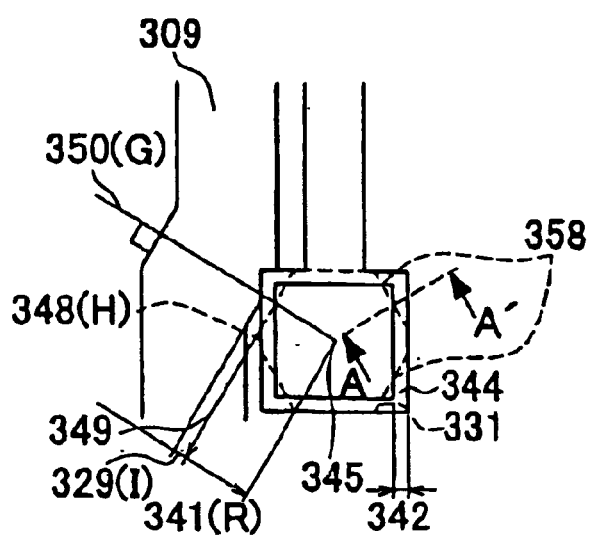

Next, the explanations of the electrodes and the wiring arranged in the semiconductor device of this embodiment will be provided in reference to FIG. 6. It is to be noted that FIG. 6 is a partially enlarged view of the electrode arranged in the semiconductor device of the present invention.

In this embodiment, different from the one described above, the central-line electrode 307 has a two-layer structure consisting of the lower electrode configured of the octagonal electrode having a hypotenuse formed to cut all the four corners of the basic rough square shaped electrode at predetermined degrees and predetermined positions and the upper electrode configured of the rough square shaped electrode with a predetermined size. In addition, the inside-line electrode 308 has a two-layer structure consisting of the lower electrode configured of the octagonal electrode having a hypotenuse formed to cut all the four corners of the basic rough square shaped electrode at predetermined degrees and predetermined positions and the upper electrode configured of the rough square shaped electrode with a predetermined size.

As shown in FIG. 6, a basic pattern of the lower electrode 331 of the central-line electrode 307 is a rough square shaped electrode and the each side is formed parallel or vertically to a pellet side 317. The length of the each side of the basic rough square shaped electrode is expressed by the minimum radius (R) 341 of the electrode necessary for wire bonding from the center 345 of the electrode. It is to be noted that the lower electrode 331 is covered with the insulating film so that the protective film is not formed thereon.

In this embodiment, the central-line electrode 307 has two hypotenuses formed to cut the rough square shaped electrode in a direction 349 which is perpendicular to a line segment G on the position (H) 348 at a distance of the minimum radius (R) 341 of the electrode necessary for wire-bonding, on the line segment (G) 350 connecting the center 315 of the lower electrode 351 of the adjacent inside-line electrode 308 and the center 345 of the lower electrode 331 of the central-line electrode 307.

Since the lower electrode 331 of the central-line electrode 307 has the hypotenuse on the position at a distance between the center of the basic rough square shaped electrode and each side of the electrode, the center 345 of the electrode becomes the center of the inscribing circle in contact with each side which is horizontal and vertical to the pellet side and with the hypotenuses.

In this embodiment, the lower electrode 331 of the central-line electrode 307 configures a octagonal electrode having four hypotenuses formed to cut all the four corners of the basic rough square shaped electrode at predetermined degrees and predetermined positions. Two sides 344 vertical to the pellet side 317 and two sides 346 horizontal to the pellet side 317 are the four sides of the basic rough square shaped electrode, and hypotenuses 352 formed to cut all the four corners are the remaining four sides.

Figure 7:
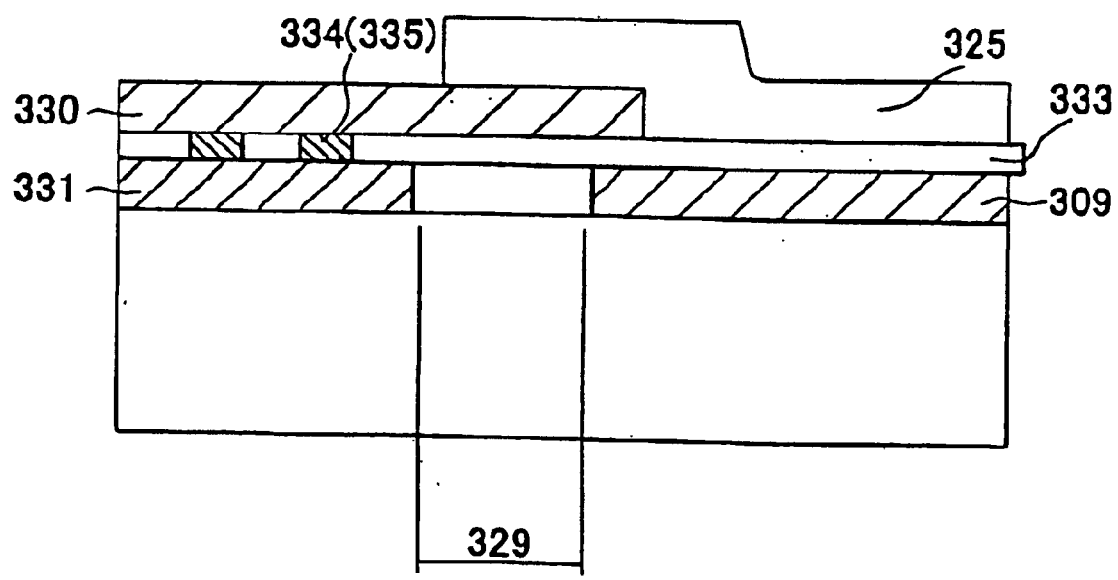
FIG. 7 is a sectional view of an electrode arranged in the semiconductor device of the third embodiment.
Figure 8:
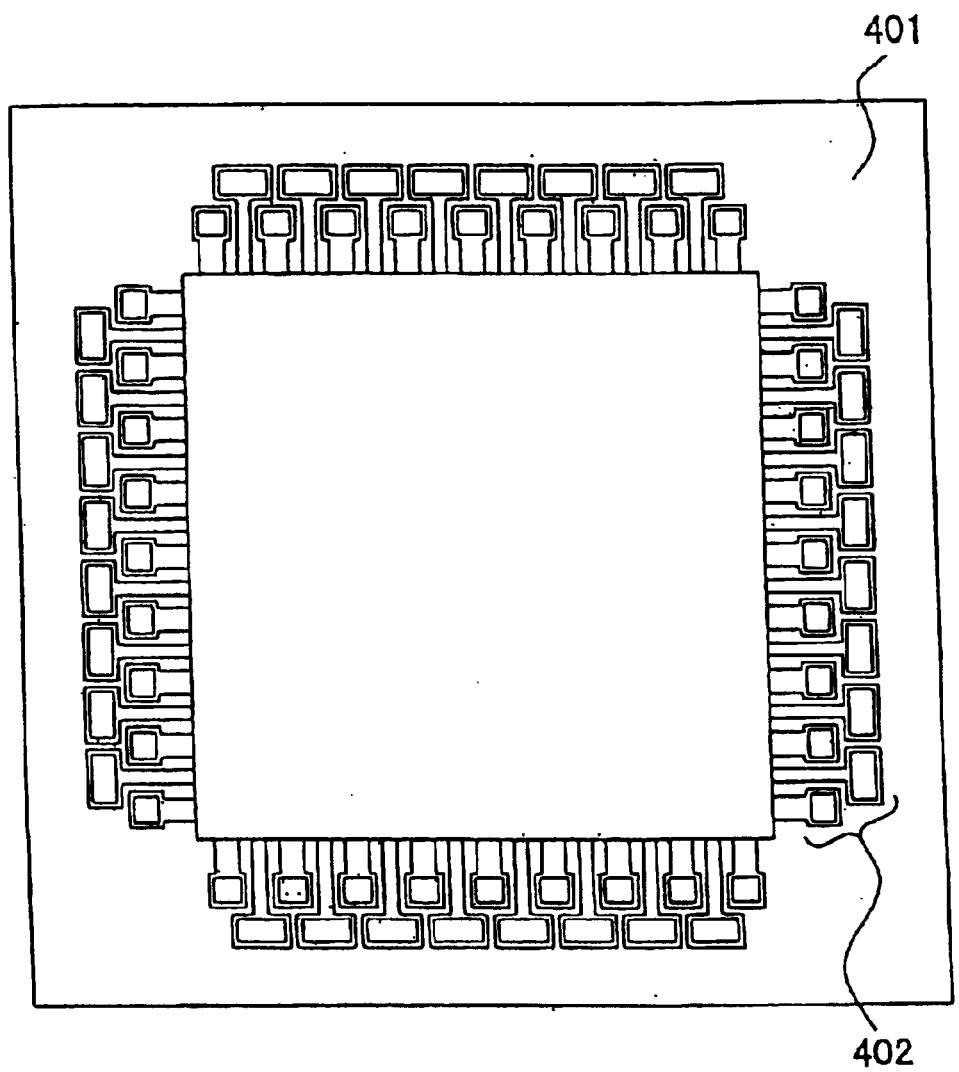
FIG. 8 is a top plan view of a conventional semiconductor device.
Figure 9:
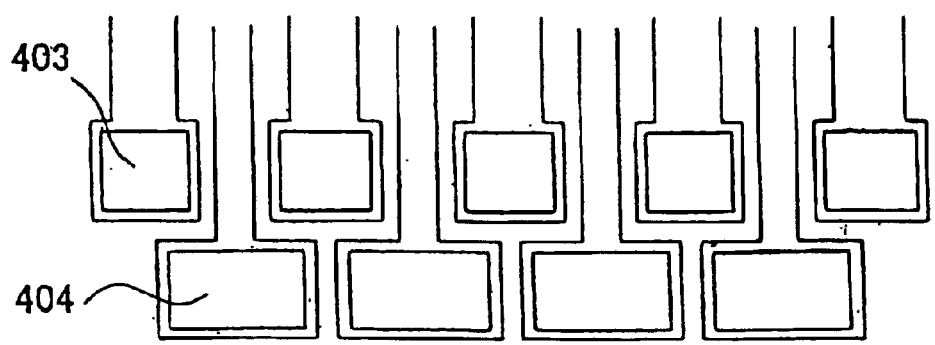
FIG. 9 is a partially enlarged view of an electrode arranged in the conventional semiconductor device.

In addition, in this embodiment, the octagonal lower electrode 331 of the central-line electrode 307 is electrically connected to the square upper electrode 330 via a metal pillar 335 formed in a through hole 334 in the insulating layer 333, as shown in FIG. 7. Further, on the upper electrode 330, the protective film 325 to protect the electrode is formed at the minimum width (F) 342 parallel to each side of the electrode.

On the other hand, a basic pattern of the lower electrode 351 of the inside-line electrode 308 is a rough square shaped electrode, and the each side is formed parallel or vertically to the pellet side 317. The length of the each side of the basic rough square shaped electrode is expressed by the minimum radius (R) 311 of the electrode necessary for wire bonding from the center 315 of the electrode. It is to be noted that the lower electrode 351 is covered with the insulating film so that the protective film is not formed thereon.

In this embodiment, the inside-line electrode 308 has two hypotenuses formed to cut the rough square shaped electrode in a direction 319 which is perpendicular to a line segment G on the position (H) 318 at a distance of the minimum radius (R) 311 of the electrode necessary for wire-bonding, on the line segment (G) 350 connecting the center 345 of the lower electrode 331 of the adjacent central-line electrode 307 and the center 345 of the lower electrode 351 of the inside-line electrode 307.

Since the lower electrode 351 of the inside-line electrode 308 has the hypotenuse on the position at a distance between the center of the basic rough square shaped electrode and each side of the electrode, the center 315 of the electrode becomes the center of the inscribing circle in contact with each side which is horizontal and vertical to the pellet side and with the hypotenuses.

In this embodiment, the lower electrode 351 of the inside-line electrode 308 configures a octagonal electrode having four hypotenuses formed to cut all the four corners of the basic rough square shaped electrode at predetermined degrees and predetermined positions. Two sides 314 vertical to the pellet side 317 and two sides 316 horizontal to the pellet side 317 are the four sides of the basic rough square shaped electrode, and hypotenuses 320 formed to cut all the four corners are the remaining four sides.

In addition, in this embodiment, the octagonal lower electrode 351 of the inside-line electrode 308 is electrically connected to the square upper electrode 352 via a metal pillar formed in a through hole in the insulating layer, similar to the case of the central-line electrode 307. Further, on the upper electrode 352, the protective film to protect the electrode is formed at the minimum width (F) 312 parallel to each side of the electrode.

In this embodiment, the lower electrode 331 of the central-line electrode 307 and the lower electrode 331 of the inside-line electrode 308 are the hexagonal electrodes on which the hypotenuses facing each other are formed and on which the hypotenuses cutting the two corners in the opposite direction are formed at the same time. Further, the upper electrode, which is electrically connected to the lower electrode via the insulating layer, has a rough square shape.

Between the lower electrode 331 of the central-line electrode 307 and the lower electrode 351 of the inside-line electrode 308, which are configured as described above, a wiring 309 for connecting the internal circuit 310 of the semiconductor pellet 301 to the outside-line electrode 308 is formed parallel to the hypotenuses of the central-line electrode 307 and the inside-line electrode 308.

The maximum width 321 of the wiring 309 for the outside-line electrode, which is formed intermediately parallel to the hypotenuses 320 and 358 of the lower electrode 335 of the central-line electrode 307 and the lower electrode 335 of the inside-line electrode 308, is decided by the distance between the center of the lower electrode 331 of the central electrode 307 and the center of the lower electrode 351 of the inside-line electrode 308, which is calculated from the distance of vertical direction (A) 322 between the centers of the electrodes and the distance of horizontal direction (B) 323 between the centers of the electrodes, the minimum length (R) 311 and 341 of the electrode necessary for wire-bonding and the minimum length (I) 329 of the electric conductor, and is showed by a following expression;

$$\text{the maximum wiring width } 321 \text{ between the hypotenuses} = (A^2 + B^2)^{1/2} - (R+I) \times 2$$

In this embodiment, since the octagonal lower electrode is covered with the insulating film and the protective film is not formed, the lower electrode can be formed smaller by the amount in which the protective film is not formed. Consequently, the width of wiring can be widened.

Also, assuming that the thicknesses of the wirings are roughly identical each other, the maximum current of the outside-line electrode 304 will be proportional to the width 321 of wiring of the hypotenuse. Consequently, the width between the hypotenuses is to be decided by the necessary value of the current. The interval 323 between the adjacent central-line electrode 307 and the inside-line electrode 308, and the position and form of the central-line electrode 307 and the inside-line electrode 308, is to be decided by calculating backward from the above-mentioned expression.

In this embodiment, since the protective film is not formed on the lower electrode, the width between the lower electrodes can be further widened by the amount in which the protective film is not formed. Consequently, the width of wiring of the outside-line electrode connected to the internal circuit can be widened. In addition, since the inside-line electrode has a hypotenuse formed to cut two corners on the side of the pellet side, the degree of freedom of wiring of the outside-line electrode can be enhanced. Further, since the central-line electrode has a hypotenuse formed to cut two corners on the side of the pellet side, the degree of freedom of wiring can be further enhanced.

Since the central-line electrode and the inside-line electrode are not arranged as linearly as they have been conventionally, the wrong recognition of the adjacent electrode and the short defect with the adjacent wire are to be decreased gradually at the process of wire-bonding. Further, since all the surfaces of the electrodes are formed in a square shape or a rectangle shape, the position of the electrode can be smoothly recognized in a short time at the process of wire bonding.

According to the third embodiment, since the insulating layer is formed on the parts of the lower electrodes of the central-line electrode and the inside-line electrode, the protective film need not be formed on the electrode. Consequently, the wiring is set between the lower electrodes of the central-line electrode and the inside-line electrode. The width of wiring of the outside-line electrode connected to the internal circuit can be further widened. Consequently, the electrode can be used as the one for a large amount of electric current, for example, an electric power supply. Further, since all the surfaces of the electrodes are formed in a square shape or a rectangle shape, the position of the electrode can be smoothly recognized in a short time at the process of wire bonding and the productivity of the semiconductor device is increased.

Although the semiconductor device according to the preferred embodiment of the present invention has been described, the present invention is not restricted to such examples. It is evident to those skilled in the art that the present invention may be modified or changed within a technical philosophy thereof and it is understood that naturally these belong to the technical philosophy of the present invention.

In the third embodiment, for example, the explanation is provided with regard to the configuration that the central-line electrode and the inside-line electrode have two-layer structures. However, if the uppermost layer of the electrode have a rough square shape, the embodiment can be achieved with a lower electrode having two layers or more.

In addition, in this embodiment, the explanation is provided with regard to the example that the outside-line electrode is located in the middle of the central-line electrode and the inside-line electrode which are adjacent each other and are arranged at regular intervals. However, the embodiment can be achieved even in the case that the central-line electrode and the inside-line electrode are not arranged at regular intervals.

Further, in the first and second embodiment, the explanation is provided with regard to the configuration that the outside-line electrode is formed in a square shape or a rectangle shape. However, the embodiment can be achieved even in the case that the outside-line electrode is shaped identically to that of the central-line electrode and the inside-line electrode.

Since the width of wiring of the outside-line electrode connected to the internal circuit, which is wider than the conventional width of wiring, the outside-line electrode can be used as the one for a large amount of electric current, for example, an electric power supply.

Further, since the electrode of the inside-line electrode and the electrode of the outside-line electrode are set apart each other, in recognizing the position of the electrode at the process of wire bonding, the adjacent electrode is not wrongly recognized.

What is claimed is:

1. A semiconductor device with staggered arrangement in three lines with an inside-line electrode, a central-line electrode and an outside-line electrode on a peripheral part of a surface of a semiconductor pellet, wherein the inside-line electrode is configured as an octagonal electrode having an hypotenuse on a central-line electrode side formed to cut vertically on a position at a distance of a sum of a minimum length (R) of an electrode necessary for wire-bonding and a minimum length (F) of an electrode protective film from a center of the electrode on a line connecting a center of a rough square shaped electrode with each side consisted of the sum of the minimum length (R) of the electrode necessary for wire-bonding and the minimum length (F) of the electrode protective film and a center of an adjacent central-line electrode, and having an hypotenuse on a pellet side formed in a symmetrical position with the central-line electrode and parallel to the hypotenuse on the central-line electrode side in the pellet side direction, the central-line electrode is configured as an octagonal electrode having hypotenuse on an inside-line electrode side formed to cut vertically on a position at a distance of the sum of the minimum length (R) of the electrode necessary for wire-bonding and the minimum length (F) of the electrode protective film from the center of the electrode on a line connecting the center of a rough square shaped electrode with each side consisted of the sum of the minimum length (R) of the electrode necessary for wire-bonding and the minimum length (F) of the electrode protective film and a center of an adjacent inside-line electrode, and having an hypotenuse on an outside-line electrode side formed in a symmetrical position with the inside-line electrode and parallel to the hypotenuse on the inside-line electrode side in an opposite direction of the pellet side; and a maximum wiring width of an outside-line electrode intermediately parallel to the hypotenuse of the central-line electrode and the hypotenuse of the inside-line electrode is determined based on a following expression, considering a necessary minimum conductor interval (I) between the central-line electrode and the inside-line electrode:

the maximum wiring width=$(A^2+B^2)^{1/2}-(R+F+I)\times 2$, wherein A is a distance between the center of the inside-line electrode and the center of the central-line electrode in a direction perpendicular to the three lines, and B is a distance between the center of the inside-line electrode and the center of the outside-line electrode in a direction parallel to the three lines.

2. The semiconductor device according to claim 1, wherein the outside-line electrode is formed as a square shape or a rectangle shape in which a ratio of sides is from 1 to 2.

3. The semiconductor device according to claim 1, wherein the outside-line electrode is formed as having identical shape as the central-line electrode or the inside-line electrode.

4. The semiconductor device according to claim 1, wherein the central-line electrode and the inside-line electrode are arranged at regular intervals.

5. The semiconductor device according to claim 1, wherein the central-line electrode and the inside-line electrode are each arranged at arbitrary intervals.

6. A semiconductor device having inside-line electrodes, central-line electrodes and outside-line electrodes respectively arranged along three lines on a peripheral surface of a semiconductor pellet, each inside-line electrode having octagonal shape with hypotenuses on central-line electrodes and pellet sides thereof, wherein lengths of respective imaginary lines from centers of the inside-line electrodes that intersect sides of the respective inside-line electrodes at right angles each equal a sum of a minimum length R of an inside-line electrode necessary for wire-bonding and a minimum length F of an electrode protective film, each central-line electrode having octagonal shape with hypotenuses on inside-line electrodes and outside-line electrodes sides thereof, wherein lengths of respective imaginary lines from centers of the central-line electrodes that intersect sides of the respective central-line electrodes at right angles each equal the sum of the minimum length R and the minimum length F, an imaginary line that cuts through an hypotenuse of an inside-line electrode at a right angle being collinear with an imaginary line that cuts through an hypotenuse of a central-line electrode adjacent thereto at a right angle, and a maximum width of a wire connected to an outside-line electrode and a central portion of the semiconductor pellet so as to be between and parallel to hypotenuses of an inside-line electrode and a central-line electrode that are adjacent each other, is set in view of a necessary minimum conductor interval I between the corresponding inside-line and central-line electrodes, such that the maximum width of the wire is:

$$(A^2+B^2)^{1/2} - (R+F+I) \times 2,$$

wherein A is a distance between the center of the inside-line electrode and the center of the central-line electrode adjacent thereto in a direction perpendicular to the three lines, and B is a distance between the center of the inside-line electrode and the center of the central-line electrode adjacent thereto in a direction parallel to the three lines.

7. The semiconductor device of claim 6, wherein each outside-line electrode is square or rectangular shaped with a ratio of sides from 1 to 2.

8. The semiconductor device of claim 6, wherein each outside-line electrode is identically shaped as the inside-line electrodes or the central-line electrodes.

9. The semiconductor device of claim 6, wherein the inside-line electrodes and the central-line electrodes are arranged at regular intervals.

10. The semiconductor device of claim 6, wherein the inside-line electrodes and the outside-line electrodes are each arranged at arbitrary intervals.

* * * * *